United States Patent

Matsumoto et al.

[11] Patent Number: 5,874,735
[45] Date of Patent: Feb. 23, 1999

[54] SCANNING ELECTRON MICROSCOPE

[75] Inventors: Tokusaburo Matsumoto; Kouzo Yano; Toshihiko Eida, all of Tokyo, Japan

[73] Assignee: Hitachi Instruments Service Co., Ltd., Tokyo, Japan

[21] Appl. No.: 840,170

[22] Filed: Apr. 14, 1997

[30] Foreign Application Priority Data

Sep. 24, 1996 [JP] Japan .................................. 8-251178

[51] Int. Cl.$^6$ ...................................................... H01J 37/28
[52] U.S. Cl. ............................................................. 250/310
[58] Field of Search .................................. 250/310, 306, 250/396 R, 396 ML

[56] References Cited

U.S. PATENT DOCUMENTS

| | | | |
|---|---|---|---|
| 3,909,610 | 9/1975 | Kokubo | 250/310 |
| 4,020,343 | 4/1977 | Shimaya et al. | 250/310 |
| 4,943,722 | 7/1990 | Breton et al. | 250/310 |
| 4,948,971 | 8/1990 | Vogen et al. | 250/310 |

*Primary Examiner*—Kiet T. Nguyen

[57] ABSTRACT

A scanning electron microscope having a unit for reducing image obstacle in an scanning electron microscope which is capable of inexpensively and readily reducing image obstacle caused by any external disturbance such as alternative magnetic field and mechanical vibration in relation to the location of installation of the microscope. In order to reduce the image obstacle, the electron beam deflectors or image shift coils for forming visual image by scanning the surface of sample by using collimated electron beam, is applied superimposing with alternative current for forming alternative magnetic field of the identical frequency, identical intensity, and inverted phase of vibration to the external disturbance to cancel out the fluctuation caused by the external disturbance in the sample surface at the focal plane of the electron beam.

11 Claims, 2 Drawing Sheets

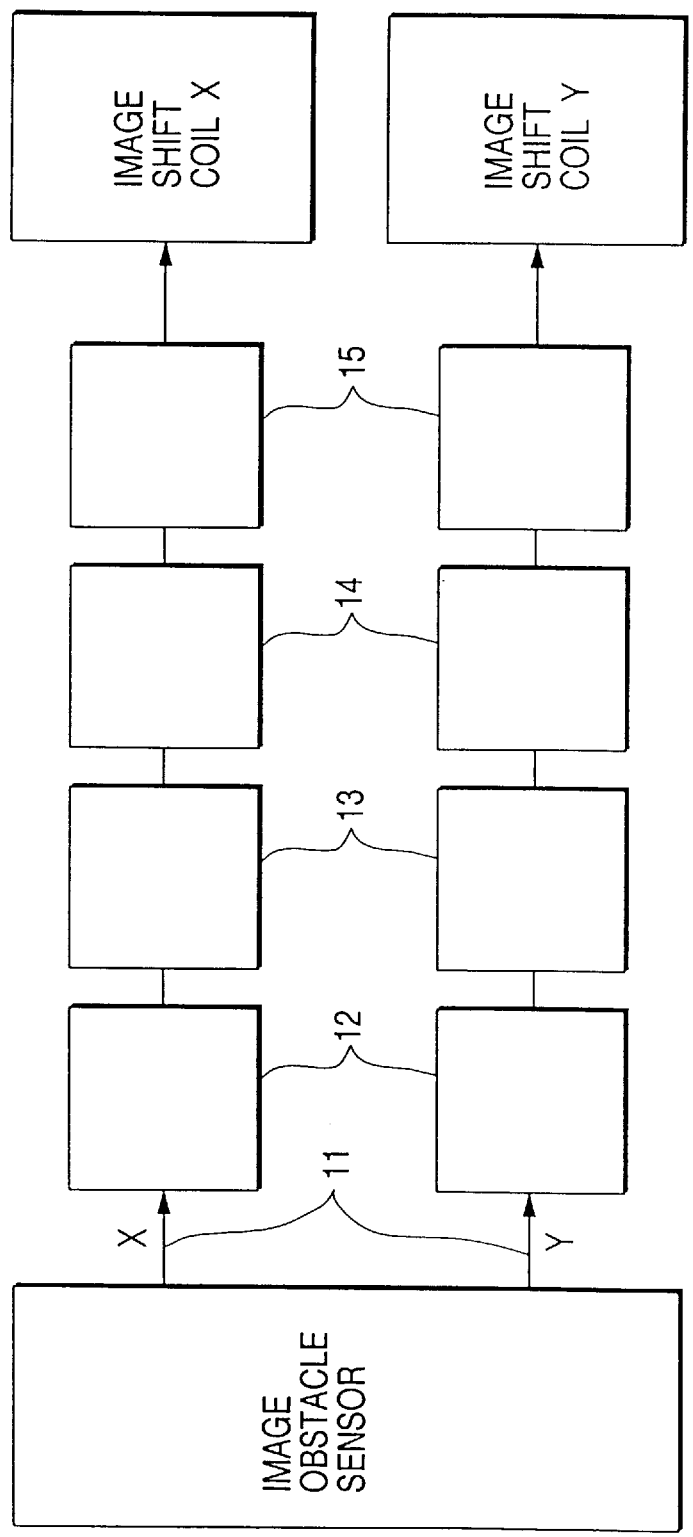

SCANNING ELECTRON MICROSCOPE

BACKGROUND OF THE INVENTION

1. Field of the Invention

The present invention is related to a scanning electron microscope (SEM), more particularly, to a scanning electron microscope incorporating a unit for reducing image obstacle caused by external disturbances.

2. Description of the Prior Art

The scanning electron microscope (SEM) is, in general, an apparatus for observing an enlarged image of the surface of samples by emitting an electron beam from an electron beam gun, collimating the beam with electronic lenses, and scanning the sample surface with the collimated electron beam by means of a deflector, in order to form image signals by detecting secondary electrons such as secondary or reflected electrons generated from the sample by the electron beam irradiation.

In case that the SEM apparatus is installed in a location of fluctuated external environment, the electron beam may be improperly deflected by external disturbances so that the scanning image will be disarranged. Some typical examples of the external disturbances resulting in the disarranged scanning image include, for example, mechanical vibration and alternative magnetic fields penetrating from the surrounding environment. In order to overcome this problem the conventional SEM has means such as an antivibration structure or a magnetic shield with a microscopic housing. However the effect of such conventional means is limited. Due to recent higher performance (highly magnifyable) apparatus with the extension of the applicable fields being wider, more serious cases arise in which image problems occur due to the installation environment of the microscope.

In order to achieve the solution of these problems, for example for the mechanical vibration, a large vibration insulator is mounted on the floor of the microscopy room, and the entire microscope system is installed thereon. For the alternative magnetic field, the entire microscope system may be enclosed within a large iron box for shielding the magnetic field, or large coils may be installed in the X and Y direction in the space surrounding the scanning electron microscope apparatus to generate inverted magnetic fields in synchronism with the incoming external magnetic fields by supplying electric current to the coils in order to cancel out the external fields.

For alternative magnetic fields, in general, when taking photographs of the image, by synchronizing the scan of the electron beam with the power supply, the synchronized electron beam scanning with the fluctuation of the electron beam affected by the external alternative magnetic fields may prevent the image from blurring.

Such means for reducing image obstacles as described above require for the SEM to be installed in a specially designed and constructed room Thus the apparatus may not be used where it is needed to be used, and its cost may be extremely high.

When synchronizing the electron beam scan with the power supply frequency, no blurred image may result from the effect of the external alternative magnetic fields. However, the raster of the electron beam may miss the original straight beam line to, for example, draw a curved trajectory such as sinusoidal raster trajectory. The image thus formed and arranged on a monitor screen may or may not indicate correctly the accurate and precise structure of the sample, and may be distorted.

SUMMARY OF THE INVENTION

The present invention has been made to solve the above described problems, by providing a scanning electron microscope system having a unit for reducing image obstacles, without modifying the existing microscopy system.

In order to achieve the object, the present invention includes connecting an alternative power supply which may arbitrarily vary the frequency, amplitude, and phase of the current waveforms to the electron beam deflector of the scanning electron microscope system, and superimposing an alternative magnetic field from the alternative power supply to the electron beam deflector to thereby correct the disordered scanning of the electron beam due to any external disturbances in order to minimize the problems on the scanning image. This allows a scanning electron microscopy system to be installed, without setting up the location with any special construction or devices, to inexpensively and readily minimize the image problem.

BRIEF DESCRIPTION OF THE DRAWINGS

The present invention will become more fully understood accompanying drawings which are given by way of illustration only, and thus are not limitative of the present invention, and wherein:

FIG. 2 shows an illustrative block diagram of a power supply generating corrective magnetic field for reducing image problems in accordance with the present invention.

DETAILED DESCRIPTION OF THE INVENTION

Figure 1:
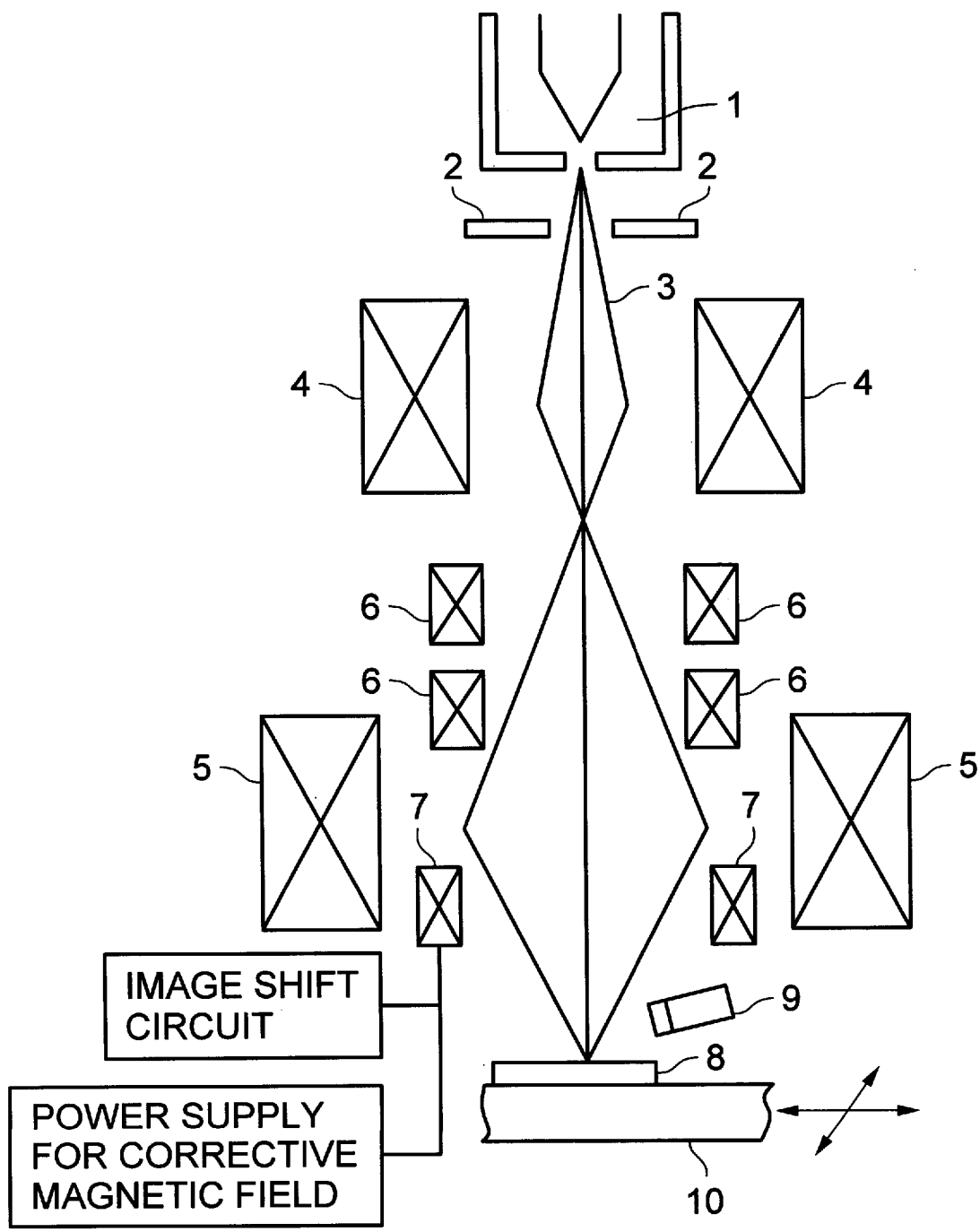
FIG. 1 shows an illustrative schematic diagram of a scanning electron microscope with a unit for reducing image problems in accordance with the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

The present invention relates to a device for minimizing image problems due to any externally incoming disturbances in a scanning electron microscope system. The scanning electron microscope (SEM), is an apparatus in which, as shown in FIG. 1, the electron beam 3 emitted from the electron beam source 1 and accelerated by anode 2 is finely collimated with the collimator lens 4 and objective lens 5 to be irradiated on a sample 8. In addition, the electron beam is deflected by an electron beam deflector 6 mounted between the collimator lens 4 and the objective lens 5 for scanning the sample 8 surface with very fine electron beam 3. As the irradiation of the electron beam 3 causes the sample 8 surface to produce secondary or reflected electrons, which are detected by detector 9 to visualize the texture of the surface of the sample 8. In the SEM thus produced image may be blurred or distorted by the fluctuation of the electron beam being scanning the sample 8 due to any external disturbances such as mechanical vibration and alternative magnetic fields coming from the outside, depending on the location of the installed system. The present invention is aimed to reducing such image obstacles such as blurring and distortion. A preferred embodiment of the present invention will be described in great detail below, for an exemplary case with external disturbances created by an alternative magnetic field, in which image shift coils are used, and with deflector for reducing image obstacles including by image shift coil. When using an image shift coil, sample carrier 10 supporting the sample 8 is mechanically moved for normal transfer of the field of view, while a direct current is supplied to the image shift coil 7 mounted in the vicinity of the path of the electron beam 3 to slightly deflect the beam 3 for the fine displacement of high magnitude images.

In order to reduce the image obstacles, alternative current is superimposed in synchronism with the alternative magnetic field of the external disturbances to the image shift coil 7 to form an alternative magnetic field of inverted phase in the image shift coil 7. The direction and the intensity of the alternative magnetic field have to be adjusted so as to cancel the quantity of fluctuation, caused by the external disturbances, at the surface of the sample 8, of the electron beam 3 scanning the surface of the sample 8. That means that superimposing both magnetic fields causes the fluctuation of the electron beam 3 scanning the sample 8 to be canceled, so as to obtain a raster of regular straight beam.

The power supply which generates an alternative magnetic field for reducing image obstacles as described above will be explained in greater detail below in conjunction with FIG. 2. In this power supply the characteristics of the incoming external disturbances causing the image obstacles, i.e., frequency, amplitude, direction and so on of the fluctuation, are required to be predetermined. In the present invention, the characteristics are determined based on the image obstacle signal 11 formed on the focal plane and detected by an image obstacle sensor. If the external disturbances include an alternative magnetic field, the quantity of fluctuation may be detected by means of an alternative magnetic field detector mounted outside of the apparatus or the alternative magnetic field detector mounted inside (in the beam path) of the SEM, or the amplitude, direction frequency and so on of the external disturbances may be detected by observing a distortion in an image signed of reference sample having a regular fine structure with the scanning electron microscope. Then the thus obtained image obstacle correction signal is, as shown in FIG. 2, connected to the respective X and Y axes of the image shift coil 7, respectively, through the input amplifier 12 of the correction signal, phase shift circuit 13, inverter 14, and buffer amplifier 15 (emitter follower) for superimposing it with the deflecting power for image shifting without interference of each other. Then the intensity of the correction current flowing through the X and Y axes of the coil 7 is separately adjusted to alter the direction and the strength of the correction magnetic field by the sum of vectors of the magnetic fields in the direction of X and Y generated by these coils. By precisely reversing the phase of the correction field with respect to the alternative magnetic field forming the external disturbance, the blurring and distortion of the image on the focal plane will be removed. Therefore, image obstacles may be significantly reduced even when observing images (unsynchronized power), in which alternative magnetic fields may more readily affect, as compared to capturing photographs.

Although in above description an alternative magnetic field for reducing image obstacle is generated by using the image shift coil 7, the same effect may be obtained by performing with the deflector coil 6 deflecting the electron beam for forming the raster beam. While in the above description the present invention has been explained by example of an alternative magnetic field as the external disturbance, the equivalent reduction of image obstacles may be obtained for the case of mechanical vibration, by predetermining the effect of the vibration to the image by using image obstacle sensor if the vibration frequency is constant.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A scanning electron microscope which collimates an electron beam emitted from an electron beam gun with an electron lens, scans a surface of a sample by using a deflector and detects electrons secondarily generated from said sample surface to form an image thereof, comprising:

an alternative power supply for altering the frequency, amplitude, and phase of a current waveform connected to said electron beam deflector to form an alternative magnetic field in said deflector, wherein the electron beam is deflected in accordance with said alternative magnetic field to correct disordered scanning caused by an external disturbance.

2. A scanning electron microscope according to claim 1, wherein image shift coils of said scanning electron microscope are used for the electron beam deflector and connected to said alternative power supply.

3. A scanning electron microscope according to claim 1, wherein said alternative power supply comprises an image obstacle sensor for generating an image obstacle correction signal of the scanning electron microscope, and two sets at least one pair of a correction input signal amplifier for supplying an alternative current for correction to each of coils of X and Y axes in said deflector in accordance with the correcting signal, a phase shifter circuit, an inverter circuit, and a buffer amplifier circuit.

4. An electron microscope comprising:

an electron beam generating means for generating an electron beam for scanning a sample;

a field detecting means for detecting a waveform characteristic of an external field generated by an external disturbance;

a correction field generating means for generating a correction field having a waveform characteristic inverse to said detected waveform characteristic of said external field; and a deflection means, connected to said correction field generating means, for deflecting said electron beam in accordance with said correction field to offset effects of said detected external field.

5. The electron microscope according to claim 4, wherein said detected external field is a magnetic field.

6. The electron microscope according to claim 4, wherein said detected waveform characteristic is a phase of said detected external field.

7. The electron microscope according to claim 4, wherein said deflection means offsets the effects of said detected external field in both an X-axis direction and a Y-axis direction.

8. The electron microscope according to claim 4, said correction field generating means including a power supply which varies waveform characteristics of current flowing therefrom to generate said correction field.

9. The electron microscope according to claim 4, wherein said correction field generating means superimposes alternative current in synchronism with said detected external field to generate said correction field.

10. The electron microscope according to claim 4, said deflection means including a plurality of image shift coils.

11. The electron microscope according to claim 4, said correction field generating means including, an image obstacle sensor for generating an image obstacle correction signal, and an input signal amplifier for supplying alternative current to said deflection means in accordance with said image obstacle correction signal, a phase shifter circuit, an inverter circuit, and a buffer amplifier circuit.

* * * * *